United States Patent [19]

Stark

[11] 4,289,118
[45] Sep. 15, 1981

[54] SOLAR ENERGY SYSTEM WITH PIVOTING LENS AND COLLECTOR AND CONDUIT SYSTEM THEREFOR

[75] Inventor: Virgil Stark, New York, N.Y.

[73] Assignee: North American Utility Construction Corp., New York, N.Y.

[21] Appl. No.: 920,288

[22] Filed: Jun. 29, 1978

[51] Int. Cl.³ .............................................. F24J 3/02
[52] U.S. Cl. .................................. 126/440; 126/425; 126/438; 126/443
[58] Field of Search ............... 126/424, 425, 438, 439, 126/440, 443; 136/89 PC

[56] References Cited

U.S. PATENT DOCUMENTS

| | | |
|---|---|---|
| 1,683,266 | 9/1928 | Shipman . |
| 1,704,173 | 3/1929 | Chesney . |
| 2,872,915 | 2/1959 | Bowen . |
| 2,920,710 | 1/1960 | Howard .......................... 126/424 X |
| 3,289,756 | 12/1966 | Jaeger ................................ 165/155 |
| 3,902,794 | 9/1975 | Abrams . |
| 3,987,781 | 10/1976 | Nozik et al. .......................... 126/443 |
| 3,990,914 | 11/1976 | Weinstein et al. .................. 126/438 |
| 4,045,246 | 8/1977 | Mlavsky et al. ..................... 126/439 |
| 4,064,865 | 12/1977 | Depew ................................. 126/440 |
| 4,066,062 | 1/1978 | Houston . |
| 4,068,653 | 1/1978 | Bourdon et al. .................... 126/440 |
| 4,069,812 | 1/1978 | O'Neill ................................ 126/440 |
| 4,108,154 | 8/1978 | Nelson . |
| 4,134,392 | 1/1979 | Livermore et al. ................. 126/439 |
| 4,134,393 | 1/1979 | Stark et al. . |
| 4,147,561 | 4/1979 | Knight ................................. 126/440 |
| 4,151,828 | 5/1979 | Mather et al. ...................... 126/443 |
| 5,158,356 | 6/1979 | Wininger . |

FOREIGN PATENT DOCUMENTS

| | | | |
|---|---|---|---|
| 131069 | 1/1949 | Australia . | |
| 555420 | 6/1923 | France ................................ 126/440 |
| 41-3860 | 3/1966 | Japan . | |
| 51-2043 | 1/1976 | Japan . | |

Primary Examiner—James C. Yeung
Assistant Examiner—Larry Jones
Attorney, Agent, or Firm—Kenyon & Kenyon

[57] ABSTRACT

A system in which solar energy is concentrated by an elongated lens in an elongated focus and collected in an elongated collector is disclosed. The lens is supported above the collector for pivotal movement with respect to the conduit about a first axis thereof to track the sun with the conduit remaining stationary. The collector further includes a container having an elongated solar energy transmitting aperture facing the lens along and adjacent to which the conduit extends, the container and lens being interconnected for pivotal movement with respect to the conduit about the first axis to maintain the aperture facing the lens with the conduit remaining stationary while the interconnected lens and container are pivoted. In one embodiment, the interconnected lens, container and conduit are also pivoted about a second axis transverse to the first axis. One embodiment of a conduit system includes an inner metal conduit having darkened outer surfaces to absorb solar energy and transmit heat to a fluid in the metal conduit. The metal conduit is enclosed by an enclosure and a dead space is provided around the inner metal conduit. In one embodiment, photovoltaic cells are installed in an inner transparent conduit in which the elongated focus of a Fresnel lens is located. The inner conduit is enclosed by an outer transparent conduit of at least about 3 times larger diameter and a fluid is circulated in the outer conduit which will substantially transmit therethrough the luminous solar energy while absorbing substantial amounts of the infrared solar energy.

4 Claims, 11 Drawing Figures

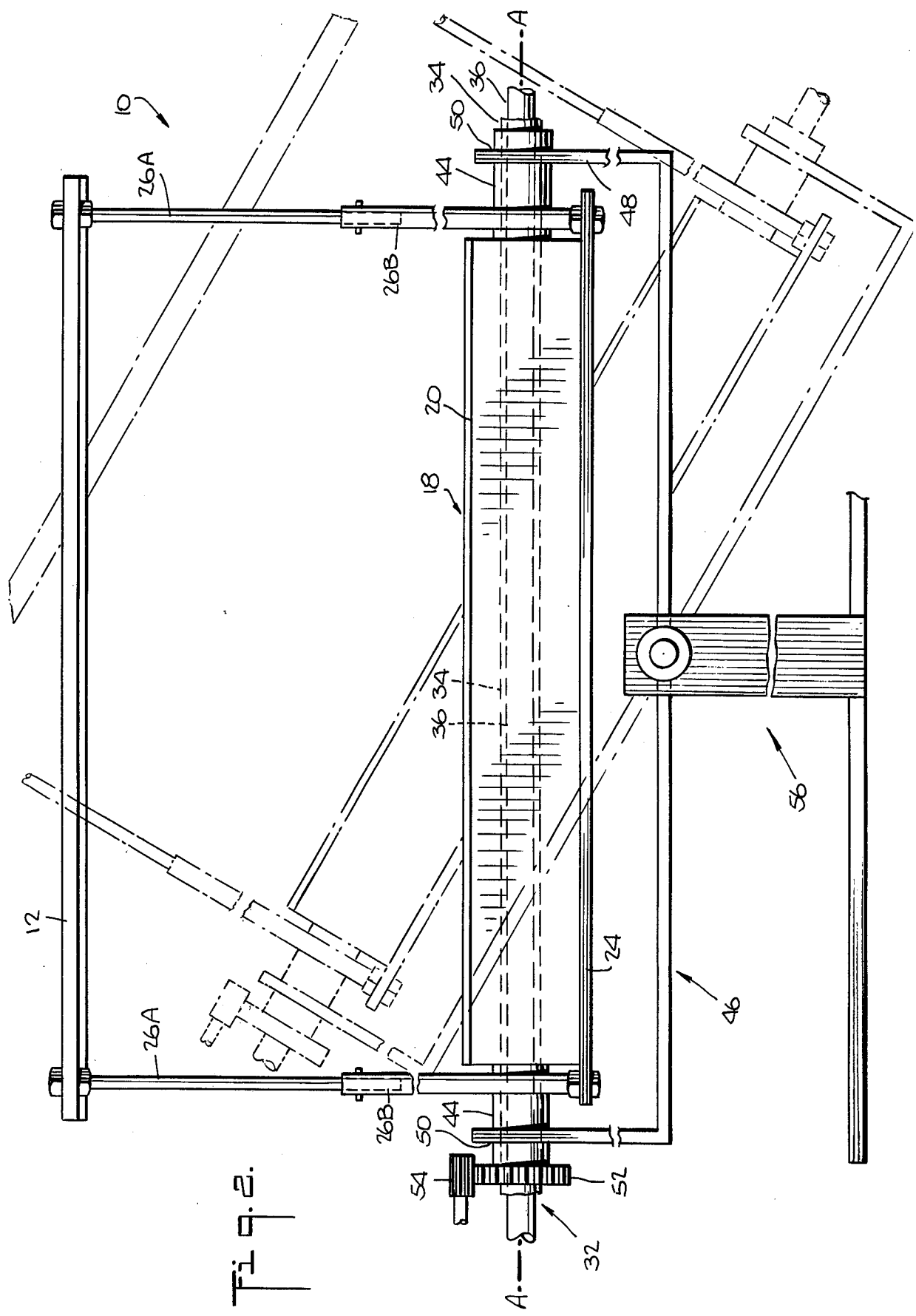

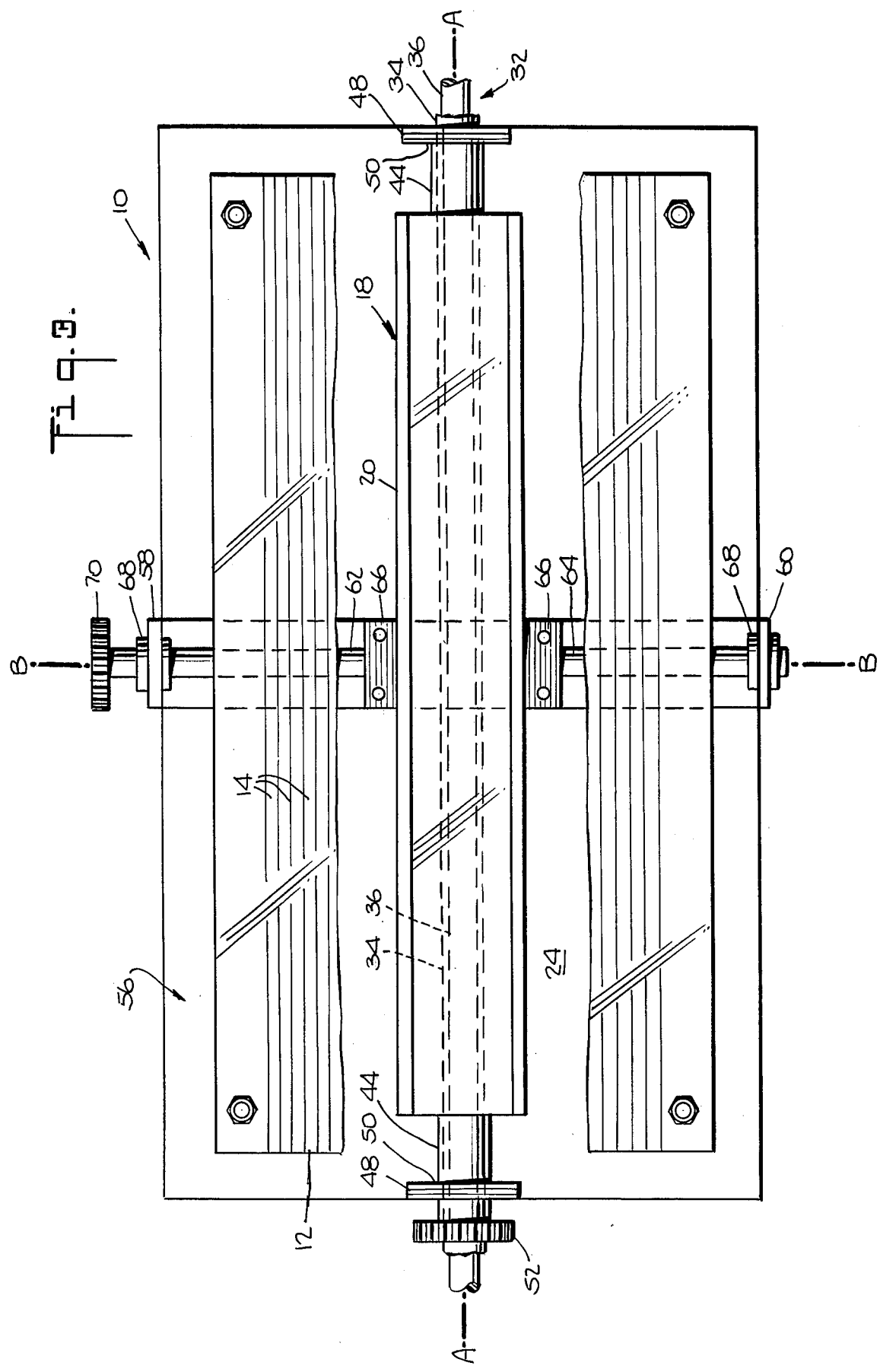

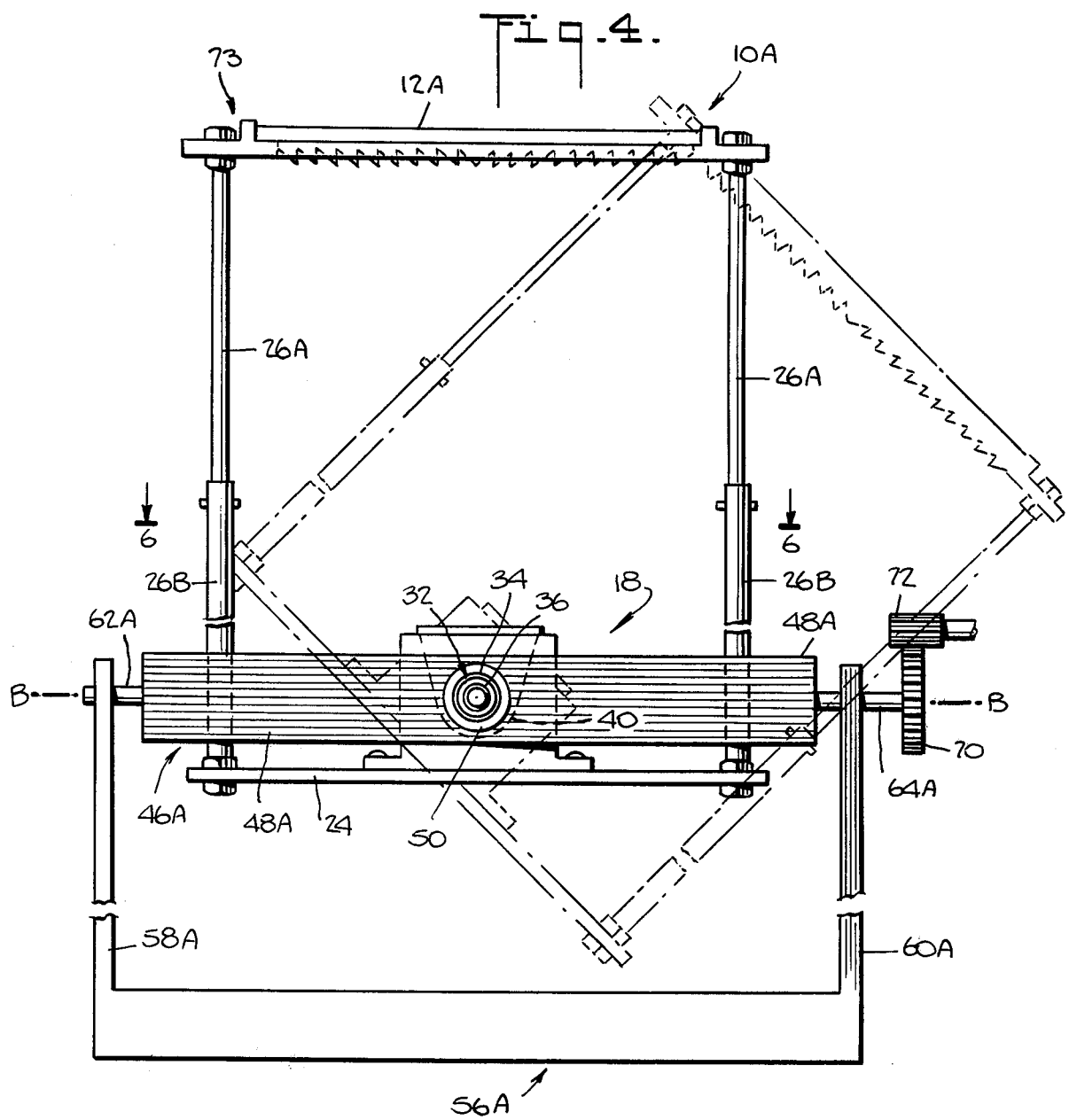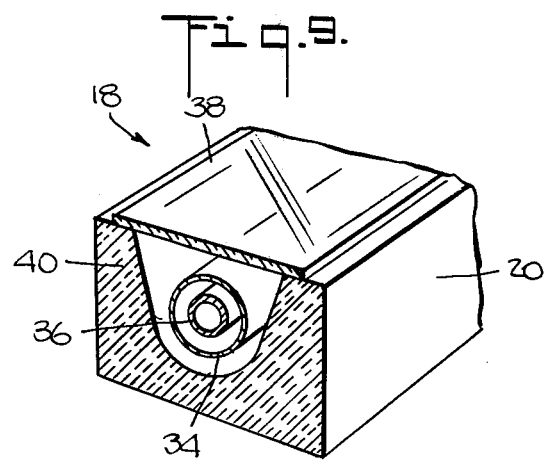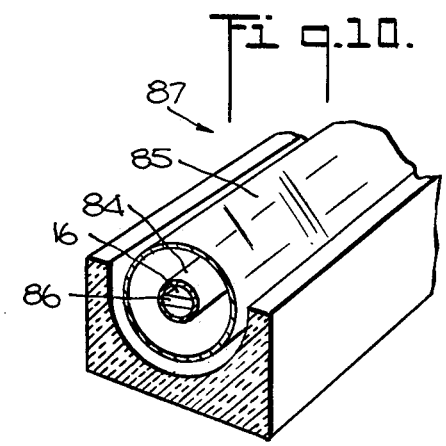

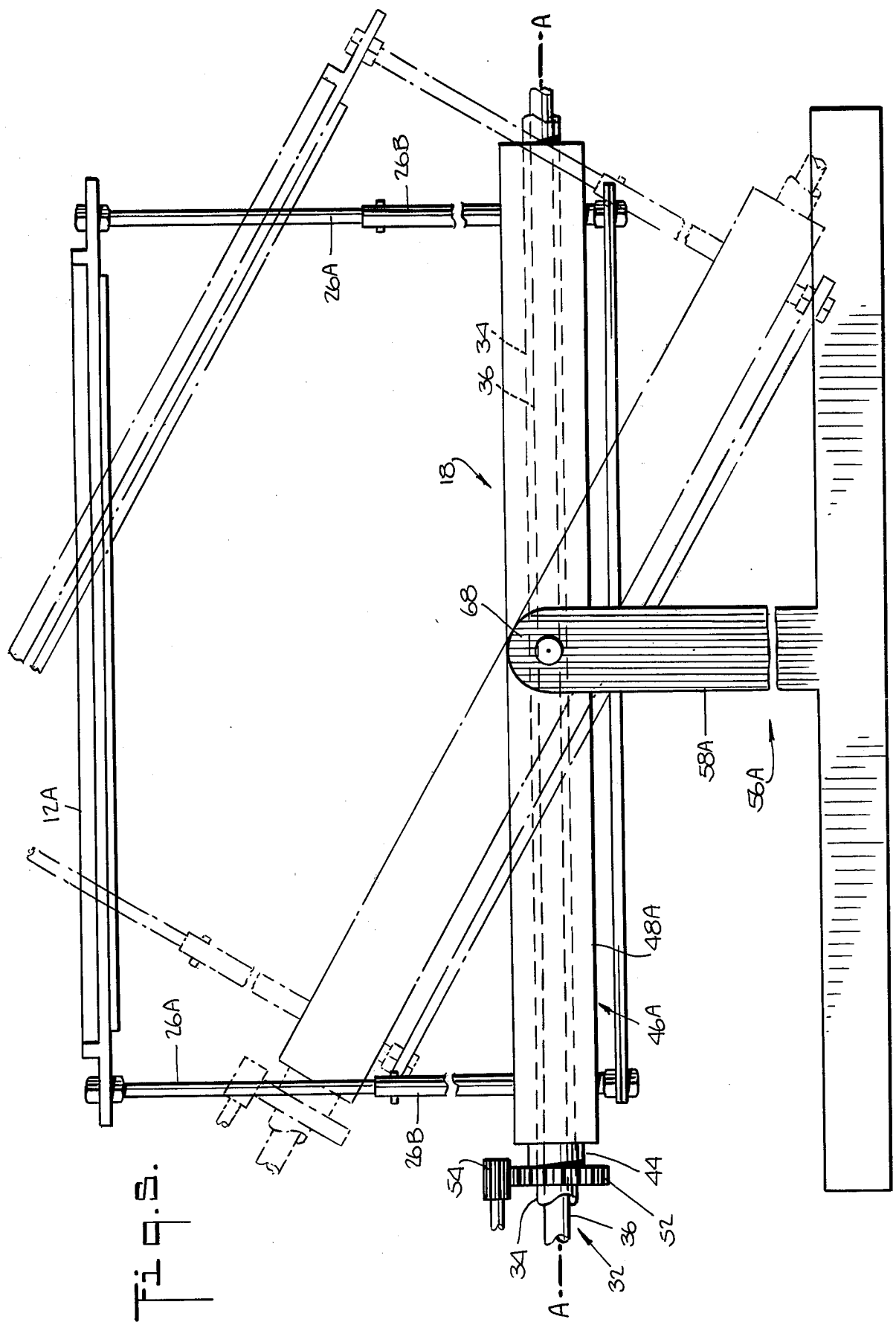

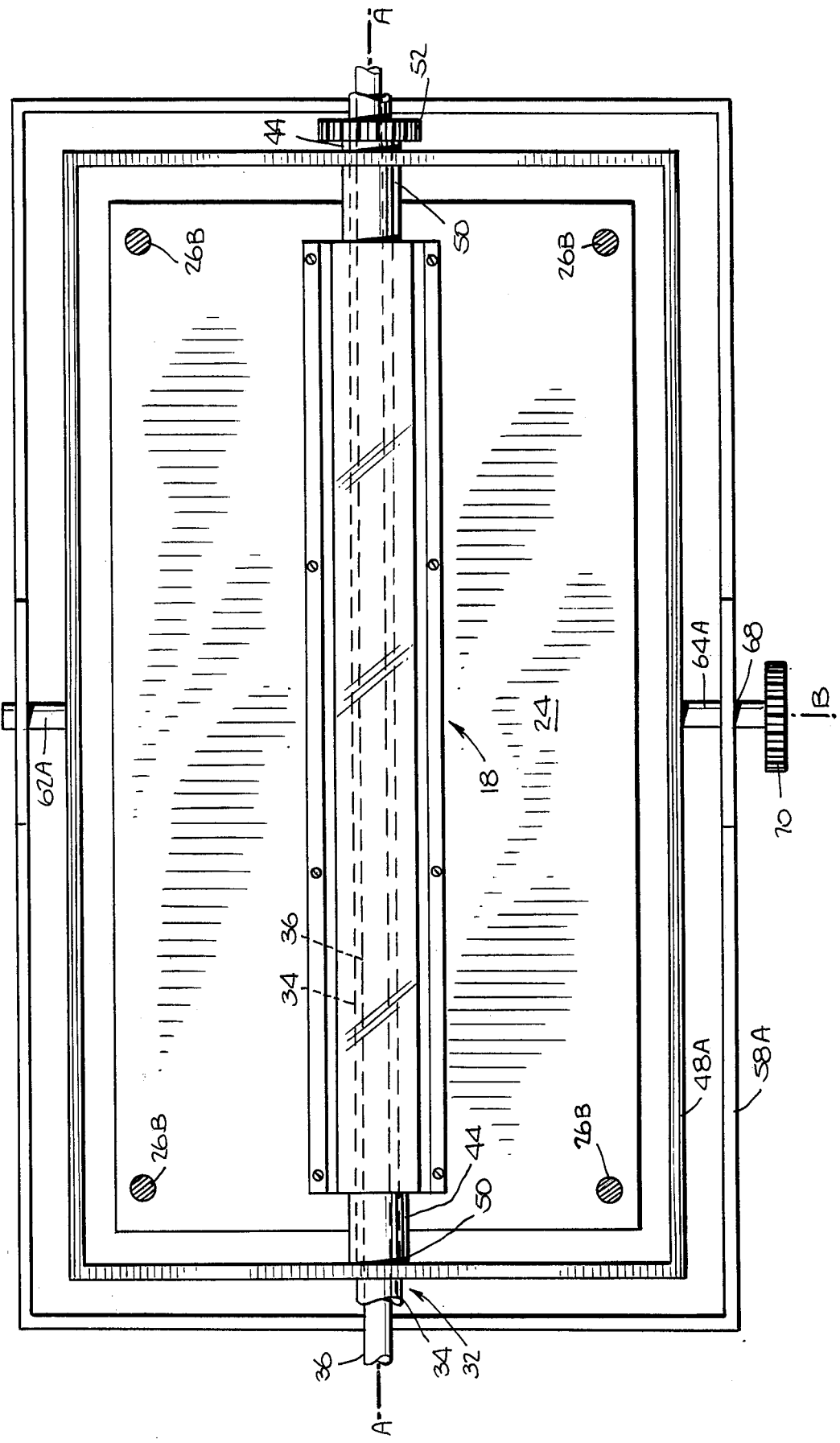

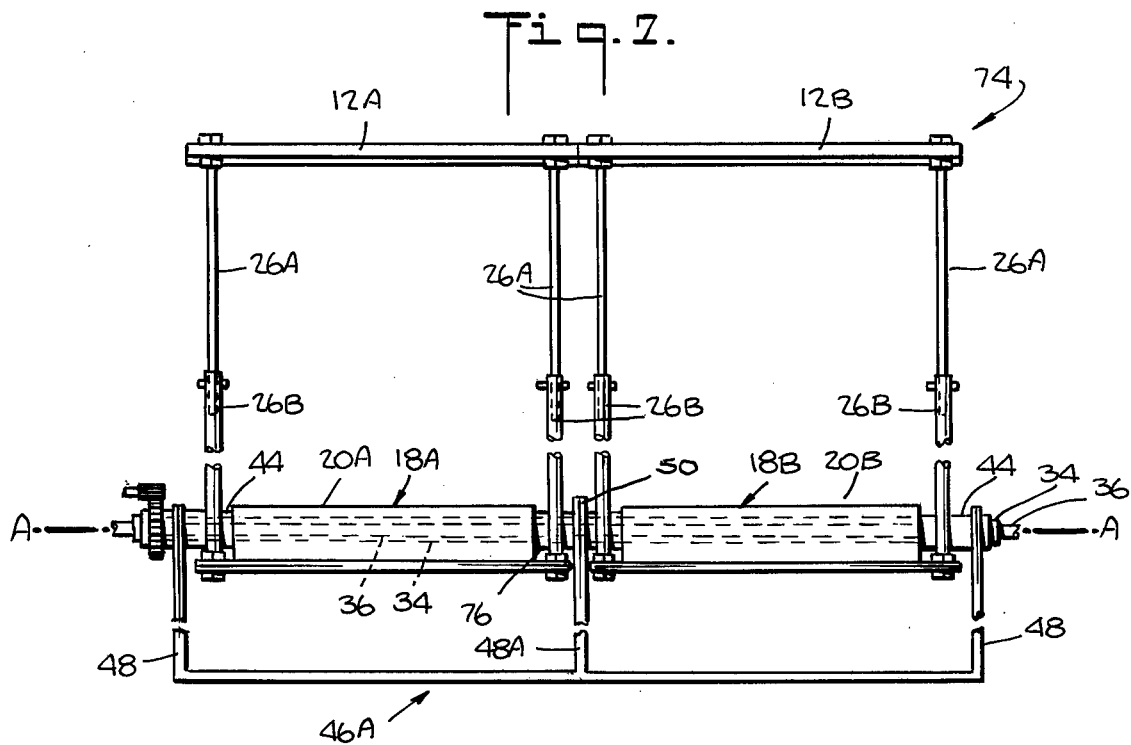
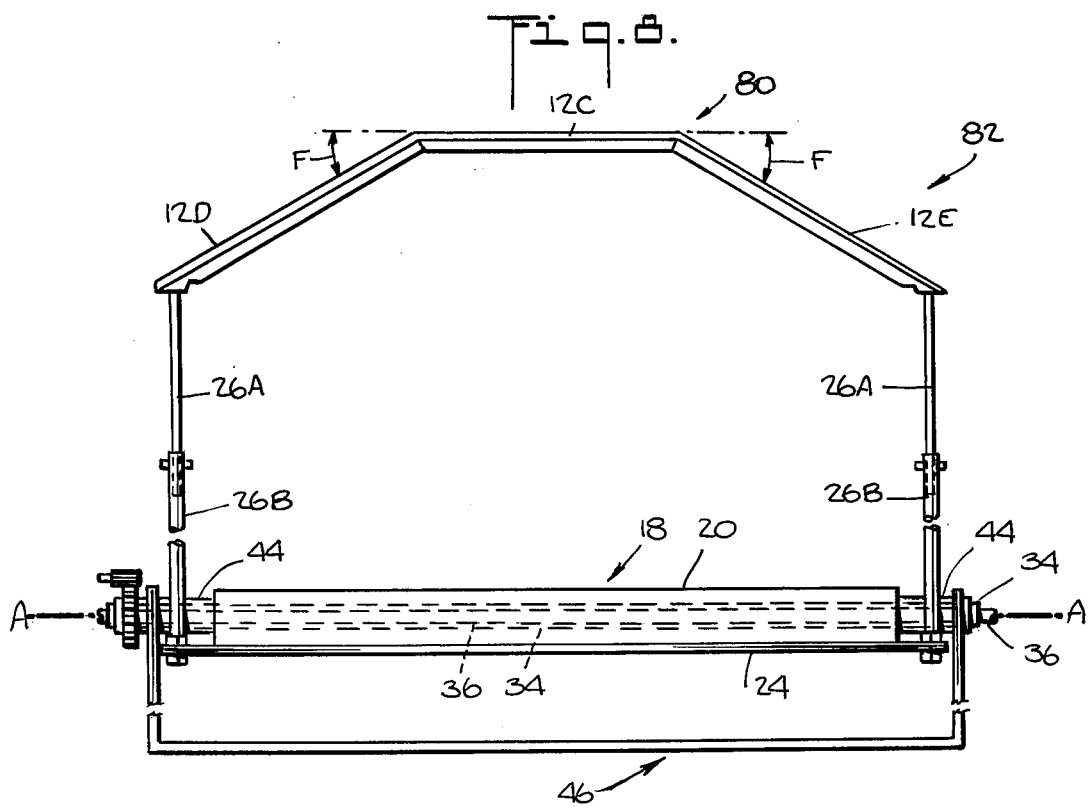

SOLAR ENERGY SYSTEM WITH PIVOTING LENS AND COLLECTOR AND CONDUIT SYSTEM THEREFOR

BACKGROUND OF THE INVENTION

The present invention relates to methods and apparatus for concentrating and collecting solar energy and more particularly to methods and apparatus utilizing elongated lenses and elongated conduits in which parts of the system are movable to track the sun. The invention also relates to conduit systems for collecting and converting solar energy to heat and to electricity.

Co-pending Application Ser. No. 746,065 filed on Nov. 30, 1976 on which U.S. Pat. No. 4,134,393 issued on Jan. 16, 1979, of which I am the sole assignee, discloses elongated lenses for concentrating solar energy in an elongated focus and an elongated collector which includes at least two conduits therein with the elongated focus being located substantially in or on and substantially along the length of one of the conduits. However, while it is appreciated that tracking the sun will increase collection, U.S. Pat. No. 4,134,393 merely teaches pivoting the lens to track the sun. See for examples FIGS. 11, 18–22, and 25–27 of U.S. Pat. No. 4,134,393.

U.S. Pat. No. 4,134,393 also discloses a collector having a plurality of conduits each of which contains a fluid therein which is circulated therethrough. There is, however, no disclosure of an enclosure for an inner conduit having a darkened outer surface which absorbs the solar energy focused thereon.

SUMMARY OF THE INVENTION

It is an object of the present invention to increase solar energy collection in a system which includes elongated lens means and an elongated collector by tracking the sun.

It is also an object of the present invention to provide such a tracking solar energy system in which an elongated conduit of the collector remains stationary during movement of the other parts of the system.

It is another object of the present invention to provide a conduit system for collecting solar energy which is capable of carrying fluids at high temperatures with reduced heat losses.

It is still another object of the present invention to provide the aforementioned conduit system in which metal piping enclosed by glass tubing form conduits of the system, the metal piping having a darkened outer surface which absorbs the solar energy.

It is yet another object of the present invention to provide a collector having photovoltaic cells therein for conversion of solar energy to electricity in which the efficiency of the cells is not substantially reduced by heat otherwise produced by infrared solar energy.

Briefly, these and other objects of the present invention are achieved: by concentrating the solar energy in an elongated focus located substantially in or on the surface of and substantially along at least one conduit and at least pivoting the lens means about a first axis of the at least one conduit; by a conduit system in which an inner conduit is enclosed by an enclosure with the enclosed inner conduit and enclosure being enclosed by an outer conduit; and by a collector having inner and outer conduits which are transparent at least in part with photovoltaic cells being disposed in the inner conduit and a fluid which absorbs substantial amounts of infrared solar energy circulated in the outer conduit.

More particularly according to a first aspect of the invention, the solar energy is concentrated by elongated lens means in an elongated focus and collected in an elongated collector which includes at least one elongated conduit, the elongated focus being located substantially in or on the surface of and substantially along the at least one conduit and at least the lens means being supported above that at least one conduit for pivotal movement thereof with respect to the at least one conduit about the first axis to track the sun. Further in accordance with this aspect of the invention, the elongated collector includes an elongaged container having an elongated solar energy aperture therein which faces the lens means, along and adjacent to which the at least one conduit extends, the lens means and container being interconnected for pivotal movement with respect to the at least one conduit about the first axis to maintain the aperture facing the lens means while the at least one conduit remains stationary. In accordance with another aspect of the invention, the interconnected lens means, container and at least one conduit are pivotable about another axis transverse to the first axis.

In accordance with the first aspect of the invention, first support means are provided for supporting the lens means above the at least one conduit to locate the elongated focus of the lens means substantially in or on and substantially along the at least one conduit and for pivotal movement of at least the lens means with respect to the at least one conduit about the first axis with the at least one conduit remaining stationary. The first support means includes connecting means interconnecting the lens means and the container for pivotal movement of the interconnected lens means and container with respect to the at least one conduit about the first axis.

According to a preferred embodiment, the connecting means includes a plate member to which the container is connected and a plurality of rods interconnecting the lens means and the plate member. Preferably, the moments above and below the first axis are substantially equal to substantially balance the interconnected lens, plate and container about the first axis. This is preferably accomplished by selection of the weight of the system components and of the distances by which they are displaced from the first axis. The container includes hollow necked portions at the ends thereof having the same axis as the first axis, and through which the at least one conduit extends, the first support means including first pivot means pivotally connecting the first support means to the necked portions. This permits the at least one conduit to remain stationary while the interconnected container and lens means are pivoted about the first axis.

In accordance with an aspect of the invention, the apparatus is disposed so the first axis extends generally in the north-south direction, so that the interconnected lens means and container may be pivoted about the first axis to track the sun on a daily basis, the conduit remaining stationary as the container is pivoted.

The apparatus in accordance with another aspect of the invention further comprises second support means for supporting the interconnected container and lens means for pivotal movement about an axis transverse to the first axis, the first support means including an elongated member supporting and connecting the first pivot means, and the second support means including second pivot means pivotally connecting the elongated member to the first support means so that the interconnected container and lens means are pivotal about the transverse axis. In accordance with this aspect of the invention, the apparatus is disposed so that the first axis extends generally in the east-west direction, so that the interconnected container and lens may be pivoted by the first support means to track the sun on a daily basis and by the second support means to track the sun on a seasonal basis.

According to the disclosure, the lens means comprises at least one Fresnel lens having prisms extending substantially parallel to the first axis.

In one disclosed embodiment of the invention, the apparatus comprises a plurality of adjacently disposed collectors and a plurality of adjacently disposed lens means, a first lens means being disposed above a first collector and a second lens means being disposed above a second collector, the collectors being aligned so that the at least one conduit extends through the collectors, and the two lens means and collectors being interconnected and supported by the first support means for pivotal movement about the first axis, the elongated focus of at least one of the lens means being located on a substantial portion of the at least conduit in at least one of the collectors regardless of season. According to this embodiment, the lens means and collectors are pivoted about the first axis only on a daily basis with the at least one conduit remaining stationary regardless of season.

In another disclosed embodiment of the invention, the lens means comprise at least three Fresnel lenses having prisms extending substantially parallel to the first axis, a central Fresnel lens having prisms extending substantially parallel to the first axis, a second Fresnel lens adjacent to one end of the central Fresnel lens and having prisms extending in the same direction as the prisms of the central lens and inclined downwardly at an angle thereto towards the collector, and a third Fresnel lens adjacent to the other end of the central Fresnel lens and having prisms extending in the same direction as the prisms of the central lens and inclined downwardly at an angle thereto towards the collector and opposed to the second Fresnel lens, so that the elongated focus of at least one of the lenses is located on a substantial portion of the at least one conduit regardless of season. According to this embodiment also, the lenses and collector are pivoted about the first axis on a daily basis with the at least one conduit remaining stationary regardless of season.

In accordance with still another aspect of the invention, an elongated conduit system for collecting solar energy in an elongated focus is provided in which the elongated focus is located substantially in or on and substantially along the conduit system, which comprises two elongated conduits for passing fluids therethrough and an enclosure for a first of the conduits, the conduits and enclosure being disposed so that an inner of the conduits containing a fluid therein is enclosed by the enclosure, there being a dead space in the enclosure surrounding the inner conduit, and an outer of the conduits containing a fluid therein encloses the enclosure and inner conduit, at least part of the enclosure and outer conduit being transparent with transparent portions thereof being aligned and adapted to transmit the solar energy in the elongated focus therethrough. The inner conduit is opaque with a darkened outer surface and the dead space in the enclosure preferably contains air, the elongated focus being located substantially on and substantially along the outer surface of the inner conduit which absorbs the solar energy and transmits heat to the fluid therein. In the preferred embodiment, the inner conduit comprises metal piping and the enclosure and outer conduit comprise glass tubing. The inner and outer conduits carry heat exchange fluids while the dead space around the inner conduit provides insulation for the fluid therein.

According to an aspect of the invention, photovoltaic cells which produce electricity from luminous solar energy of about 0.4 to about 0.7 microns wavelength are installed in an inner conduit which is transparent at least in part of an elongated collector. The elongated focus of a Fresnel lens is located on the cells in the inner conduit. The inner conduit is enclosed by an outer conduit which is transparent at least in part and of at least about 3 and preferably more than about 5 times larger diameter than the inner conduit, and a fluid is circulated in the outer conduit which will substantially transmit therethrough the luminous solar energy while absorbing substantial amounts of the infrared solar energy. Due to the large difference in diameters of the conduits and the characteristics of the fluid, most of the infrared solar energy will be absorbed by the fluid. This arrangement increases the production of electricity by the photovoltaic cells since their efficiency is not substantially reduced by the heat that would be generated by infrared solar energy otherwise reaching the cells. In the preferred embodiment, the fluid is water.

BRIEF DESCRIPTION OF THE DRAWINGS

The present invention is illustrated by way of example and not limitation in the figures of the accompanying drawings in which like references indicate similar parts and in which:

FIG. 2 is a side elevation schematic view of the solar energy apparatus and support apparatus shown in FIG. 1;

FIG. 3 is a top plan schematic view of the solar energy apparatus and support apparatus of FIG. 1;

FIGS. 4, 5 and 6 are respectively end elevation, side elevation and top plan schematic views similar to those of FIGS. 1, 2 and 3, respectively, of solar energy apparatus and support apparatus according to another embodiment of the invention, FIG. 6 being taken along lines 6—6 of FIG. 4.;

FIG. 7 is a side elevation schematic view of solar energy apparatus and of support apparatus according to the invention comprising two elongated Fresnel lenses arranged in series and two elongated collectors arranged in series, each collector including a collector container and at least one conduit therein with the conduits of the containers being connected, the lenses and collector containers being interconnected and supported by the support apparatus to permit the interconnected lenses and containers to be pivoted free of the conduits about a longitudinal axis extending through the conduits;

FIG. 8 is an end elevation schematic view of solar energy apparatus and support apparatus according to the invention including three Fresnel lenses arranged in series, with the Fresnel lenses adjacent to the central Fresnel lens being disposed at an angle thereto, and an elongated collector similar to that of FIG. 1, the Fresnel lenses and collector container being interconnected and supported by support apparatus to permit the interconnected lenses and container to be pivoted free of the conduit about a longitudinal axis extending through the conduit;

FIG. 9 is a cross-section perspective of a collector utilizable in the apparatus of FIGS. 1–8;

FIG. 10 is a cross-section perspective view of a collector which includes photovoltaic cells according to the invention.

DESCRIPTION OF THE PREFERRED EMBODIMENTS

Figure 1:
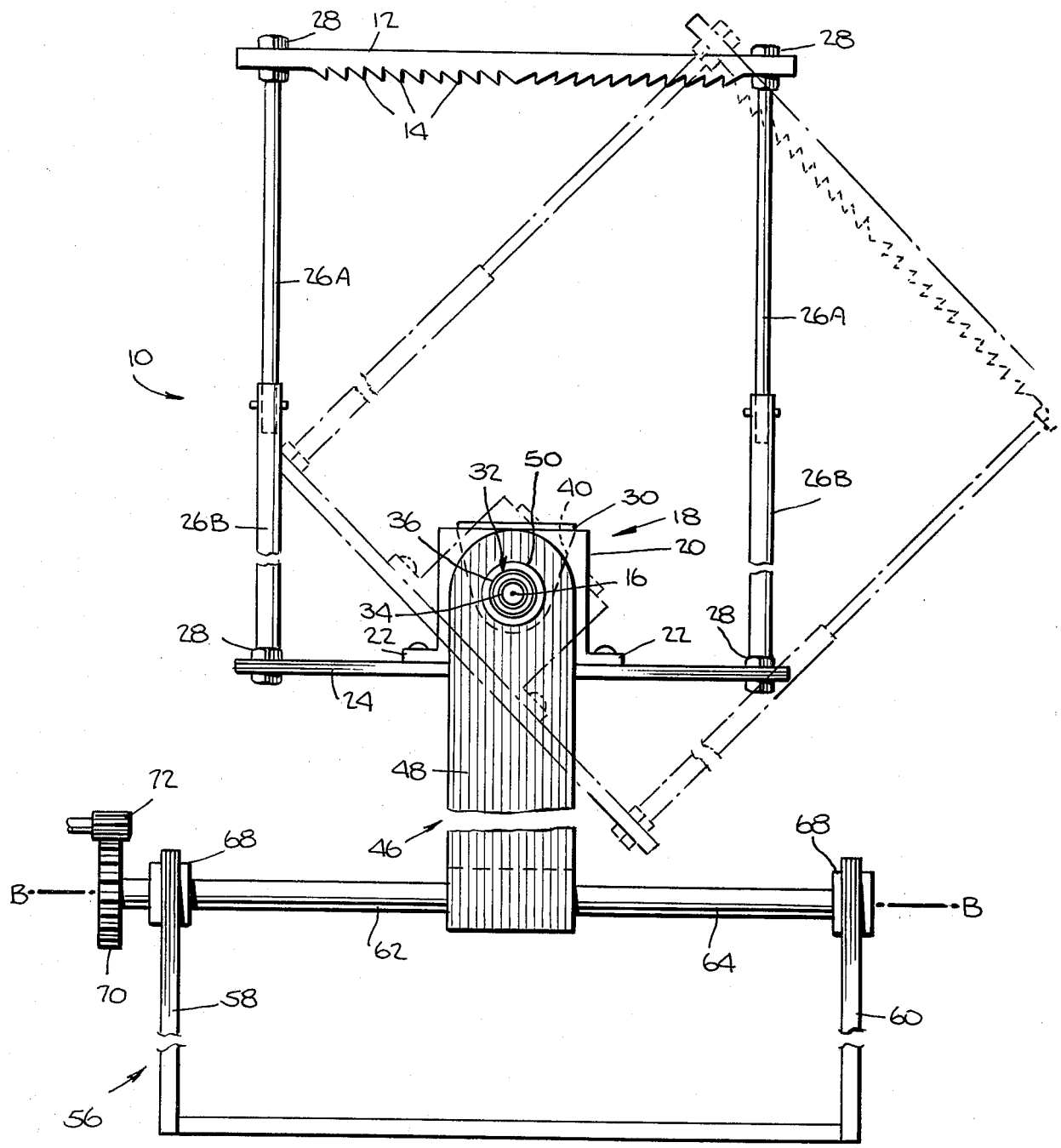
FIG. 1 is an end elevation schematic view of solar energy apparatus and support apparatus according to the invention, the solar energy apparatus including an elongated Fresnel lens and an elongated collector which comprises an elongated container having at least one elongated conduit therein, the collector container and lens being interconnected and supported by the support apparatus to permit the lens and container to be pivoted free of the conduit about a longitudinal axis extending through the conduit, and also permitting pivoting of the interconnected lens and container about another axis transverse to the longitudinal axis.

Referring more particularly to the drawings, solar energy and support apparatus according to the invention are illustrated. In FIGS. 1–3 solar energy system 10 includes an elongated Fresnel lens 12 having longitudinal prisms 14 which cause the solar energy to be concentrated in an elongated linear focus 16. Disposed below the Fresnel lens 12 at the focus 16 thereof is an elongated collector 18 which includes an insulated container 20. The bottom of the container 20 is flanged and the flanges 22 are bolted to an elongated plate 24 which is approximately the same size as the Fresnel lens 12. Telescoping interconnected rods 26A, 26B having threaded ends 28 are used to interconnect the Fresnel lens and plate. The rods are telescoped in order to adjust the distance between the Fresnel lens and the container.

The collector may be of the type described in U.S. Pat. No. 4,134,393, which is hereby incorporated by reference, and of which I am the sole assignee. Such a collector is shown in FIG. 9. Disposed in the collector container 20 is a conduit system 32 which includes conduits 34 and 36. Conduit 34 is disposed within and enclosed by conduit 36. The outer conduit 36 is wholly transparent or a portion of the outer conduit is transparent in order to allow solar energy to pass therethrough. The inner conduit 34 may be wholly or partially transparent in order to allow solar energy to pass therethrough or the inner conduit may be at least partially opaque and darkened at its bottom in order to absorb solar energy passing through the transparent part, or opaque at least along the top outer surface to absorb solar energy therealong. A heat exchange fluid is circulated through each of the conduits and the fluids are preferably different but the same type fluid may be circulated in each of the conduits. Preferably, liquids are circulated in the conduits. The collector container is insulated, as mentioned, and is closed by a transparent plate 38 which provides a greenhouse heating effect in the trough 40 in which the conduit system is disposed. The conduit system 32 is of the type described in the aforementioned patent. However, the invention is not limited to such conduit systems and a conduit system such as system shown in FIG. 11 and described hereinafter may be utilized. The Fresnel lens and collector container are interconnected and the conduit system disposed so that the elongated focus 16 is located substantially in or on and substantially along conduit 34 or conduit 36. The advantages of the elongated collector system and elongated lens in which the elongated focus is located in or on the conduits of the collector system and the operation thereof are described in the aforementioned patent.

The ends of the collector container 20 have tubular-necked portions 44 rigidly connected thereto by bolts, for example. The tubular-necked portions 44 are hollow and the conduits 34 and 36 extend therethrough. The conduits are supported freely of the collector container by support means which are not shown. As will now be described, the interconnected collector container and Fresnel lens are pivotably supported about an elongated axis A—A extending through the center of the inner conduit 34. Thus, the lens and collector container may be rotated independently of the conduits about the axis A—A.

A support 46 extends below the plate 24 and has vertically extending arms 48 which rotatably support the interconnected container and lens. Bearings 50 are disposed in arms 48 and rotatably support the tubular portions 44 connected to the container so that the container is rotatable about axis A—A. A gear 52 is rigidly connected to one tubular portion 44 so that rotation of the gear causes the interconnected container and lens to pivot. Drive gear 54 drives gear 52 to cause rotation of the system.

The interconnected lens and container are further supported by support 56 so that they may be pivoted about an axis B—B which is perpendicular to axis A—A. Support 56 extends below support 46 and includes vertically extending arms 58, 60 through which one end of shafts 62, 64 rotatably extend with the other end rigidly connected to the central portion of support 46 by bolted plates 66, for example. The shafts 62, 64 are rotatably supported in the arms 58, 60 by bearings 68 so that the shafts are freely rotatable in the arms and supported thereby, rotation of the shafts causing pivoting of the support 46 about axis B—B. A gear 70 is rigidly secured to the free end of shaft 62 such that rotation of the gear causes the shaft to rotate and pivot the support 46 and the interconnected lens and container about axis B—B. A drive gear 72 drives the gear 70.

The lens and interconnected collector container are thus supported by a gimbel system comprised of supports 46 and 56.

The system shown in FIGS. 1–3 is arranged so that the elongated axis A—A of the conduits extends in the north-south direction. As so arranged, the system is caused to rotate about axis A—A on a daily basis to follow and track the daily position of the sun. The interconnected lens and collector are rotatable to angles up to about 100°, for example, in each direction from the horizontal about axis A—A. The interconnected lens and collector are also rotatable about axis B—B but on a seasonal basis to follow the seasonal position of the sun. The interconnected lens and container are rotatable up to angles up to about 23.5° over a 90 day period in each direction about axis B—B. For example, the system will be rotated from the horizontal position to an angle of about up to 25.5° over the time span of a season, i.e. over a 90 day period. The precise angles to which the system is rotated will depend upon the latitude of the location of the system and the time of year.

Use of Fresnel lens as the concentrating element, which is of relatively low weight, reduces the weight disposed above axis A—A and permits a system weight distribution such that the system is not "top heavy" and will not be unstable in the rotated positions. The product of the weight of the plate 24 and container portions and their distance from axis A—A, i.e. the moment effectively of plate 24 about axis A—A, is chosen to equal the product of the weight of the Fresnel lens, its frame and supports and the distances thereof from axis A—A, i.e. the effective moment of the Fresnel lens. This balances the effective weight above and below the axis A—A. For instance To maintain the system in the rotated positions, the drive gears 54, 72 are locked in place after the system is rotated. Locking may be accomplished by the motor or by means associated with the gears or the shafts on which the gears are mounted.

While the gears and bearings have been shown to rotatably support and rotate the system, it is understood that other means may also be employed. For example, worms, endless belts, chains, etc. may be used.

The drive means may comprise, for example, electric motors activated and controlled by sensors such as photocells or by, clocks, electric, timers, or by computers. Automatic, semi-automatic or manual means may be used to track the sun's location to rotate the system about either or both of axes A—A and B—B. One system uses an electric motor whose shaft is turned by a small angle whenever the direct or focused sunlight hits a photocell or thermo-couple. Hydraulic systems may also be used to move the lenses and collectors. Other systems use a timer or a weight and pulley device. Movement of the sun affects the electric output of the photocell to control the motor or the motor is controlled by the timer to turn the shaft in small angular increments, or the weight and pulley device turns the shaft. Such complete systems for moving the lenses and sensing the sun's position are known.

As mentioned, with respect to motion about axis A—A extending through the inner conduits 34, the conduits are supported independently of the interconnected lens and collector container which move independently of the conduits. When the collector container moves about axis B—B, provision is made for moving the conduits with the collector container. Flexible tubing for example, may be employed to interconnect the conduits in the container to the remainder of the conduit system. However, pivoting about axis B—B is carried out for seasonal tracking and in the embodiments of FIGS. 7-8, for example, seasonal tracking is not required and the conduits remain stationary at all times.

FIGS. 1-3 illustrate a system in which an interconnected lens and collector are pivoted about at least one axis and when pivoted about axis A—A only, the conduits remain stationary. However, other systems may accomplish this and such a system according to another embodiment of the invention is shown in FIGS. 4-6. In system 10A, the first support 46A extends about the periphery of the plate 24 and pivotably supports necked portions 44 as described for FIGS. 1-3. The second support 56A extends below and about the periphery of the first support and includes central arms 58A, 60A which pivotably support the first support 46A as generally described for FIGS. 1-3. In system 10A, the Fresnel lens 12A is supported in a frame 73 which is supported by the rods 26A, 26B.

The systems shown in FIGS. 1-6 may also be arranged so that the elongated axis A—A extends generally in the east-west direction. When the systems 10, 10A are so arranged, the interconnected lens and collector container are merely supported by supports 46, 46A for rotation about the single axis A—A, i.e., supports 56, 56A are not utilized. The supports 46, 46A are used to permit rotation of the interconnected lens and collector container on a daily basis, with rotation occurring as described above over angles of up to about 110° in each direction with the horizontal. When the interconnected lens and container are supported by only supports 46, 46A for rotation about only axis A—A, then the independently supported conduits may be rigidly supported at the ends thereof since the conduits will remain stationary throughout the year.

Referring now to FIG. 7, a system 74 is illustrated which is similar to system 10 shown in FIGS. 1-3 and includes two serially arranged Fresnel lenses 12A and 12B disposed above collectors 18A and 18B, respectively. The prisms of the Fresnel lenses extend in the direction of the elongated collectors, as described for the system of FIGS. 1-3. Rods 26A, B are provided to interconnect the plate 24 to which the collector container 18 is bolted as generally described for FIGS. 1-3. The collector containers 20A, 20B are arranged and aligned along a common axis and the conduits 34, 36 of each container are aligned and interconnected so that the fluids therein circulate serially through the conduits of the two containers. The two containers 20A, 20B are interconnected by a hollow tubular-necked portion 76 through which the conduits extend between the two containers. A single support 46A supports the interconnected containers and lenses for pivotable movement about axis A—A, as in the embodiment described for FIGS. 1-3. The support 46A includes the vertically extending arms 48 which support the tubular-necked portions 44 at the exterior ends of the two containers similar to the manner in which support 46 supports the collector container 20 of FIGS. 1—3. Additionally, a vertically extending central arm 48A rotatably supports by means of a bearing 50 the tubular-necked portion 76 which interconnects the two containers.

The system 74 shown in FIG. 7 is rotated on a daily basis about axis A—A to track the sun's position as described and the system is not moved to track the sun's seasonal location as the serially disposed lenses and collectors will operate to provide a focus of at least one lens along substantial portions of at least one collector regardless of season. For example, during one season, lens 12A will focus the solar energy on collector 18A and lens 12B will focus the solar energy in collector 18B, respectively, and in other seasons, lens 12A will focus the concentrated solar energy on collectors 18A, 18B and lens 12B will focus the concentrated solar energy on collectors 18A, 18B. Thus, for any one season, there will be at least one lens focusing the solar energy on at least one of the collectors with each of the lenses focusing the solar energy on at least part of the collector disposed immediately below it.

While two serially disposed lenses and collectors have been shown and described, it is understood that three or more serially arranged lenses and corresponding serially arranged collectors may be provided so that the focus of one or more lenses will optimally concentrate the solar energy along substantial portions of one or more collectors regardless of season.

For example, if 50 collectors of, for example, 2.5 m length each are arranged in series for a total length of 125 m, the seasonal displacement of the focus from the ends of the collectors will only be a distance of, for example, about 2 m. For a total of 125 m, this represents about 1.6% percent of the total length of the serially arranged collectors.

In FIG. 8 is shown a system having an elongated collector 18 such as the one shown in FIGS. 1-3, and a lens system 80 in which the system need not be rotated to seasonally track the sun. System 82 includes a central Fresnel lens 12C and adjacent Fresnel lenses 12D and 12E disposed at an angle F with the central lens. The prisms 14 of the Fresnel lenses are serially arranged so they extend along the direction of the collector. Such a lens system is disclosed in my copending Application Ser. No. 807,513 filed on June 20, 1977. The solar energy system 82 shown in FIG. 8 is disposed with the axis A—A of the inner conduit 34, and the elongated collector 18 and lens system 80 extending in the north-south direction. The lens system 80 is interconnected with the collector container 20 using a frame, for example, in a manner similar to that described for the system 10 of FIGS. 1-3. The collector container is bolted to a plate 24 and rods 26A, B are used to rigidly interconnect the lens system and the plate. The collector container 20 includes tubular necked portions 44 which are rotatably supported on support 46 as described with respect to FIGS. 1-3. However, the system 82 is supported by only the single support 46 for rotation of the interconnected collector container and lens system about the single axis A—A as described for the embodiment of FIGS. 1-3 when arranged in the north-south direction without support 56 and as described for the embodiment of FIG. 7. Since system 82 is longitudinally disposed in the north-south direction, the interconnected collector container and lens system is rotated up to about 110° in each direction with the horizontal on a daily basis for daily tracking of the sun's position, as described with respect to FIGS. 1-7. However, since the lens system 80 includes angled lenses 12D and 12E, the lens system and collector container need not be rotated for seasonal tracking of the sun. Each of the lenses 12D and 12E are inclined at an angle F of up to about 23.5° with the horizontal over a 90 day period, depending on the location of the system. Thus, the lens system will concentrate the solar energy in the elongated focus 16 substantially in or on one of the conduits regardless of season as follows. Central lens 12C will concentrate solar energy on the collector primarily during the time closely before and closely after the fall and spring equinoxes, lens 12D will concentrate the solar energy on the collector primarily closely before and closely after the winter solstice, and lens 12E, primarily during the time closely before and closely after the summer solstice.

While the embodiments shown in FIGS. 1-8 utilize Fresnel lenses, and while they are preferred, fluid lenses and combinations of fluid and Fresnel lenses may be utilized as described in the aforementioned patent and in my copending Application Ser. No. 845,862 filed on Oct. 31, 1977.

By way of example, the Fresnel lens 46 can have an aperture of about 84 cm with a concentration of about 40 and a focal width of about 2 inches. The focal distance can be, for example, 100 cm.

According to another embodiment of the invention shown in FIG. 10, electricity is produced with photovoltaic cells at increased efficiency. The cells produce electricity from the luminous rays of the sun having a wavelength of about 0.4 to about 0.7 microns. Fresnel lenses as in FIGS. 1-8 are used to concentrate the solar energy in a linear focus 16 located within an inner transparent glass conduit 84 which is enclosed by an outer glass conduit 85 with fluids circulating in the inner and outer glass conduits. The photovoltaic cells 86 are installed in an array in the inside glass conduit as generally described in the aforementioned patent. The concentrating lens for the collector 87 of FIG. 10 is a Fresnel lens having a large aperture to allow a concentration of about 40 with the focus being located on the photovoltaic cells in the inner conduit. The use of Fresnel lenses allows larger apertures such as about 33" (84 cm) wide with a focal distance of about 40 inches (100 cm) in comparison to the smaller apertures and longer focal distances of fluid lenses. The inner conduit 84 in which the photovoltaic cells are installed, is for instance, 1 inch in diameter and is inserted in the outer conduit 85 of for instance 4½ inches diameter.

The fluid circulated in the conduits is preferably distilled water which will absorb most of the infrared rays and allow most of the luminous rays to be transmitted to be photovoltaic cells. This arrangement permits the cells to be utilized while substantially decreasing the heat produced at the cells, thus not reducing their efficiency. The fluid (water) circulating within the inner conduit 84 will further absorb infrared rays to reduce the heat otherwise produced at the cells. Additionally, the fluid in the inner conduit can act to remove any heat produced at the cells. The heat may be recovered from the fluids and utilized.

The collector 87 can be utilized in the systems of FIGS. 1-8 with the inner conduit 84 disposed along axis A—A. While inner conduit 84 is shown centered in conduit 85, it may be on or near the bottom of conduit 85 to provide a greater distance of fluid for the infrared solar energy to travel through in the outer conduit.

Figure 11:
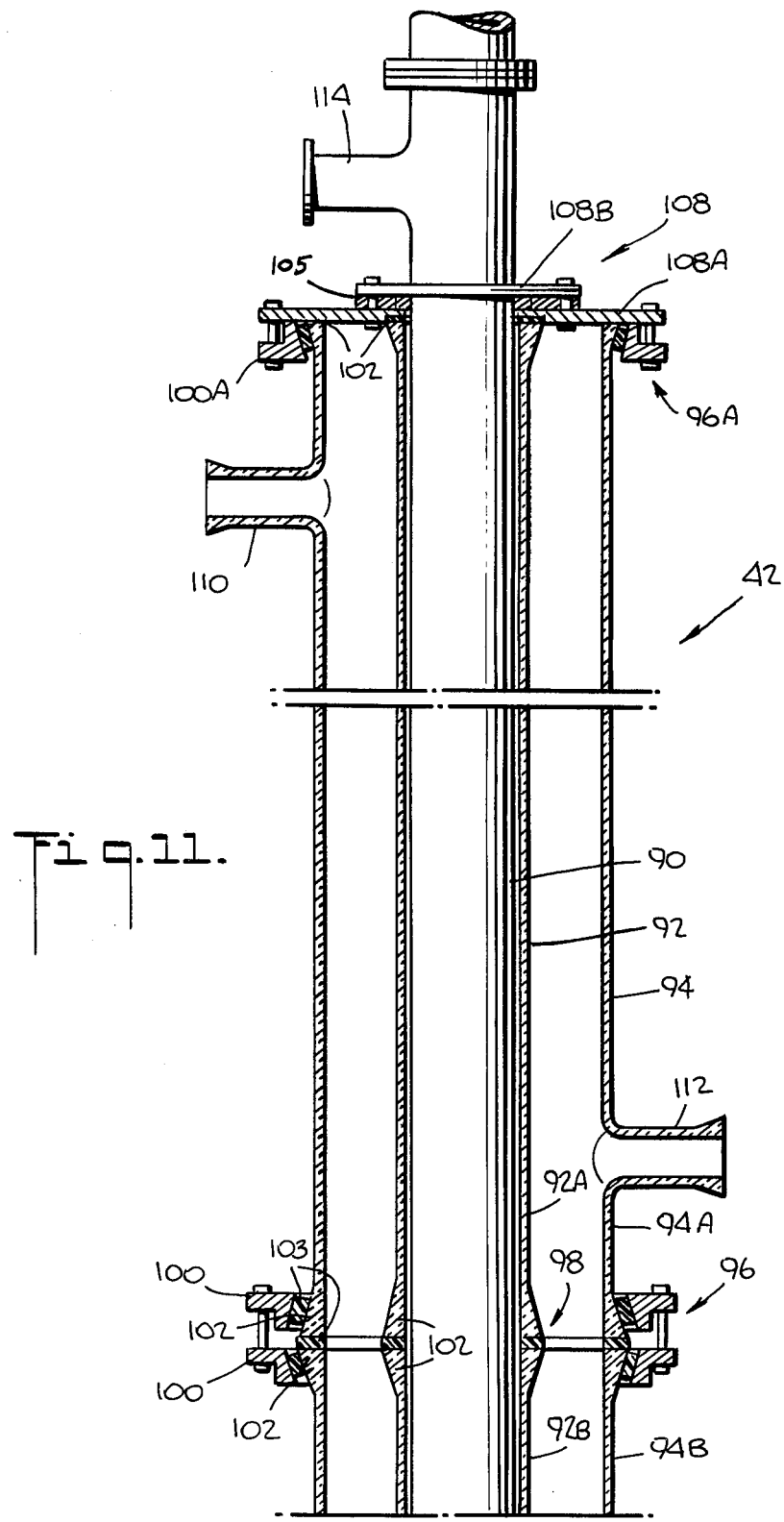
FIG. 11 is a cross-sectional schematic view of a conduit system according to the invention which includes an innermost metal conduit enclosed within intermediate and outer transparent conduits, the conduit system being utilizable in any of the collectors of FIGS. 1–8.

Conduit system 42 which may utilized in any of the foregoing systems is shown in FIG. 11 and includes elongated fluid carrying conduits 90, 92, 94, intermediate conduit 92 enclosing inner conduit 90 and outer conduit 94 enclosing conduits 90 and 92. Each of the conduits is shown to be tubular. The inner conduit 90 is opaque and blackened preferably with chrome black or a similar substance, and the conduit is preferably made of steel or copper. The intermediate and outer conduits are wholly or at least partially transparent and made of glass or plastic. In the preferred embodiment illustrated in FIG. 11, inner conduit 90 is made of steel and the intermediate and outer conduits are made of glass. Individual conduit sections are serially interconnected to form each of the conduits 90, 92, 94. Inner steel conduit 90 is formed of sections 90A, 90B . . . of steel pipe attached together. The intermediate and outer glass conduits are formed of glass tube sections 92A, 92B . . . and 94A, 94B . . . , respectively, which are joined by fittings 96, 98, respectively.

Fitting 96 comprises opposed annular flanges 100 extending about the tube sections 94A, 94B and disposed adjacent to the joint. The tube sections terminate in enlarged, flanged portions 102. A sealant 103 such as silicone fills the space between adjacent tubes and any space between the flanges 100 and the outer surface of the adjacent tube sections. The flanges 100 are drawn together by bolts, for example, and bear against flanges 102 to bring the tube sections 94A and 94B together and compress the sealant between adjacent tube sections to form the sealed joint. The enlarged flanged portions 102 provide a larger area for the sealant to engage the edges of the tube sections. Sealant is also placed between the sections of the intermediate conduit which also terminate in enlarged flanged portions 102. The outer glass tube and steel pipe may be joined, for example, by a bolted fitting 108 which secures it to the steel pipe. Fitting 108 includes spaced annular discs 108A and 108B. Disc 108A is bolted to the outer glass tube by a fitting 96A which bears against a flanged portion 102 of the tube and disc 108B is bolted to disc 108A, there being gasket 105 disposed between the discs to seal the end 109 of the conduit system. The intermediate glass tube is connected to disc 108A and bears against it so that connecting the outer tube sections to the steel pipe also draws the intermediate tube sections together to form the sealed joints. An inlet 110 and an outlet 112 are provided for introducing fluid into and removing fluid from the outer conduit 94. An inlet 114 and an outlet (not shown) are similarly provided for the inner conduit 90. The inner conduit extends past end 104 to accomodate inlet 114. Heat exchange fluids are circulated through the inner and outer conduit and air in conduit 92 surrounds the steel pipe. The inner pipe is preferably blackened, as mentioned, to enhance absorption of solar energy.

In operation, solar energy is concentrated in an elongated focus such as focus 16 in FIG. 1 and located on the surface of the inner conduit 90 to heat the fluid therein to a high temperature. The air between the steel conduit 90 and the glass conduit 92 insulates the inner conduit and reduces the heat loss therefrom. Heat which passes through the air barrier in conduit 92 is absorbed by the fluid in conduit 94 to heat it to a lower temperature than the fluid in conduit 90. The fluid in the outer conduit will also absorb directly some of the solar energy passing therethrough. However, this absorption is minimized by selection of the proper fluid. For example, Therminol 66 will absorb less solar energy than water. The fluid in conduit 90 is preferably a high boiling point liquid which may be heated up to about 300° C. for example. The fluid in the outer conduit 94 may be a lower boiling point liquid which may be heated to about 80° C. for example. Control of the circulation of the fluids in the conduits and the intensity of the sun will determine the temperatures to which the liquids will be heated.

Sections of the inner metal pipe 90 may be conventionally conneted using welds, threaded fittings, bolted fittings, etc.

The fluids in the conduits may be circulated through the conduits and heat exchangers to obtain heat and power as described in the aforementioned patent.

The arrangement shown in FIG. 11 permits the glass tube sections to be connected to the steel conduit and avoids the many problems associated with the interconnection of glass and steel.

In the embodiment shown in FIG. 11, the outer conduit can be, for example, of about 50.8 mm (2 inchs) ID and the intermediate conduit can be, for example, of about 25.4 mm (1 inch) ID. The inner conduit can be, for example, of about 20 mm ID. The conduits have a thickness which will permit at least, for example, about 1.2 mm air space between the inner and intermediate conduits.

While it is preferred that the fluids in the inner and outer conduits of the collector embodiments of FIGS. 1–8 contain different fluids, the same-type fluid may be used. This has the advantage that common heat exchangers, pumps, valves, regulation equipment, etc., may be utilized to reduce the total number required. Additionally, the fluid at the lower temperature which was circulated through the outer conduit may be passed through the heat exchanger for the inner conduit and introduced into the inner conduit in a preheated condition. Also, the fluids can be mixed to obtain a common fluid having a temperature between the lower temperature fluid (80° C. for example) and the higher temperature fluid (300°, for example). Thus, temperatures of 150° C. or 250° C. may be obtained.

When distilled water is used as the fluid in the outer conduit, a chemical such as glycol will be added to increase the boiling temperature.

Safety features may be provided to prevent overheating and overpressurization of the fluids in the conduits to prevent damage to the system. A thermostat may be used to sense temperature, and when the sensed temperature exceeds a predetermined value, the system is rotated for example to its initial morning position so that the concentration of the solar energy is reduced. Alternatively, a darkened glass plate may be rotated over the aperture of the collector to discontinue or reduce the concentration of solar energy in the collector. The surface of the plate facing the sun may be made reflective to increase the irradiation. The thermostat may control an electric motor to rotate the plate. Another way to prevent overheating is to introduce the cooler fluid of the outer conduit into the inner conduit to reduce the temperature of the fluid in the inner conduit. Also, the fluids could be evacuated from the conduits. A valve connecting the inner and outer conduits can be actuated by a thermostat to connect the conduits. Preferably an alarm is given when an over-temperature or over-pressurization condition is sensed.

The advantages of the present invention, as well as as certain changes and modifications of the disclosed embodiments thereof, will be readily apparent to those skilled in the art. It is the applicant's intention to cover by his claims all those changes and modifications which could be made to the embodiments of the invention herein chosen for the purpose of the disclosure without departing from the spirit and scope of the invention. Protection by Letters Patent of this invention in all its aspects as the same are set forth in the appended claims is sought to the broadest extent that the prior art allows.

What is claimed is:

1. Apparatus for concentrating and collecting solar energy comprising an elongated collector including an elongated container in which at least one elongated conduit extends along a first elongated axis, elongated Fresnel-type lens means having prisms extending generally parallel to said first axis for concentrating the solar energy in an elongated focus, and first support means for supporting said lens means above said at least one conduit, said container having an elongated solar energy-transmitting aperture extending generally parallel to said first axis and facing said lens means, said at least one conduit being disposed below said aperture, said first support means including connecting means interconnecting said lens means and said container at first and second spaced apart locations for pivotal movement of said interconnected lens means and container with respect to said at least one conduit about said first axis so that said aperture faces said lens means during said pivotal movement and the elongated focus of the lens means is located substantially in or on and substantially along said at least one conduit, the products of the weights times the distances of components above and below said first axis being substantially equal whereby the moments above and below said first axis are substantially equal and said apparatus is substantially balanced about said first axis, said apparatus further conprising second support means for supporting the interconnected container and lens means between said first and second locations for pivotal movement of the interconnected lens means and container about an axis transverse to said first axis.

2. The apparatus as recited in claim 1, wherein said first support means includes an elongated frame supporting said first pivot means, and said second support means includes second pivot means pivotally connecting said elongated frame to said first support means so that said interconnected container and lens means and said at least one conduit are pivotal about said transverse axis.

3. The apparatus as recited in claim 1, wherein said apparatus is disposed so that said first axis extends generally in the east-west direction, whereby said interconnected container and lens may be pivoted by said first support means to track the sun on a daily basis and by said second support means to track the sun on a seasonal basis.

4. Apparatus for concentrating and collecting solar energy comprising an elongated collector including an elongated container in which at least one elongated conduit extends along a first elongated axis, lens means comprising at least three elongated Fresnel-type lenses having prisms extending generally parallel to said first axis, each for concentrating the solar energy in an elongated focus, a central Fresnel-type lens having prisms extending substantially parallel to said first axis, a second Fresnel-type lens adjacent to one end of said central Fresnel-type lens and having prisms extending in the same direction as the prisms of said central lens and inclined downwardly at an angle thereto towards said collector, and a third Fresnel-type lens adjacent to the other end of said central Fresnel-type lens and having prisms extending in the same direction as the prisms of said central Fresnel-type lens and inclined downwardly at an angle thereto towards said collector and opposed to said second Fresnel-type lens, first supporting means for supporting said lens means above said at least one conduit, said container having an elongated solar energy-transmitting aperture extending generally parallel to said first axis and facing said lens means, said at least one conduit being disposed below said aperture, said first support means including connecting means interconnecting said lens means and said container for pivotal movement of said interconnected lens means and container with respect to said at least one conduit about said first axis so that said aperture faces said lens means during said pivotal movement and the elongated focus of at least one of the Fresnel-type lenses is located substantially in or on and substantially along said at least one conduit, the products of the weights times the distances of components above and below said first axis being substantially equal whereby the moments above and below said first axis are substantially equal and said apparatus is substantially balanced about said first axis.

* * * * *

UNITED STATES PATENT AND TRADEMARK OFFICE
CERTIFICATE OF CORRECTION

PATENT NO. : 4,289,118
DATED : September 15, 1981
INVENTOR(S) : Virgil Stark

It is certified that error appears in the above—identified patent and that said Letters Patent is hereby corrected as shown below:

Column 5, line 14, after "perspective" insert --view--.

Column 6, line 1, after "system" insert --42--;

line 59, change "100°" to --110°--.

Column 7, line 3, after "of" insert --a--;

line 15, change "To" to --to--;

line 26, after "electric" delete ",".

Column 8, lines 64-65, change "corresponding" to --correspondingly--.

Column 11, line 50, change "conneted" to --connected--.

Column 13, line 7, change "conprising" to --comprising--.

Signed and Sealed this

Fifteenth Day of December 1981

[SEAL]

Attest:

GERALD J. MOSSINGHOFF

*Attesting Officer*      *Commissioner of Patents and Trademarks*